US005611864A

United States Patent [19]
Kimura et al.

[11] Patent Number: 5,611,864
[45] Date of Patent: Mar. 18, 1997

[54] MICROWAVE PLASMA PROCESSING APPARATUS AND PROCESSING METHOD USING THE SAME

[75] Inventors: Tadashi Kimura, Kyoto; Yoshikazu Yoshida; Shinichi Mizuguchi, both of Osaka; Yasunao Okazaki, Kusatsu, all of Japan

[73] Assignee: Matsushita Electric Industrial Co., Ltd., Kadoma, Japan

[21] Appl. No.: 404,971

[22] Filed: Mar. 16, 1995

[30] Foreign Application Priority Data

Mar. 24, 1994 [JP] Japan .................................. 6-053945
Aug. 5, 1994 [JP] Japan .................................. 6-184441

[51] Int. Cl.⁶ ........................................... C23C 16/00
[52] U.S. Cl. .............. 118/723 MR; 156/643.1; 427/575; 118/723 MW
[58] Field of Search .................. 118/723 E, 723 MP, 118/723 ME, 723 MR, 723 MA, 723 MW; 156/345, 643; 427/575; 204/192.12, 192.38, 298.38

[56] References Cited

U.S. PATENT DOCUMENTS 5,234,565  8/1993  Yoshida ........................ 204/298.38

FOREIGN PATENT DOCUMENTS 62-5600   1/1987  Japan .
62-43335  9/1987  Japan .

*Primary Examiner*—R. Bruce Breneman
*Assistant Examiner*—Joni Y. Chang
*Attorney, Agent, or Firm*—Renner, Otto, Boisselle, Sklar

[57] ABSTRACT

The plasma processing apparatus of the invention generates plasma from a reactive gas with microwave power so as to process a substrate. The plasma processing apparatus includes: a vacuum chamber having an evacuation means and reactive gas inlet ports; a means for holding the substrate to be processed which is disposed inside the vacuum chamber; a dielectric plate disposed at a position facing the substrate to be processed so as to form an integral part of the vacuum chamber; a metal conductor plate disposed on an outer plane of the dielectric plate not facing the vacuum chamber so as to face the substrate to be processed; and a means for supplying microwave power substantially inverse-radially from a circumferential side of the dielectric plate towards a center thereof. Under the above construction, the microwave is supplied substantially inverse-radially from the circumferential side of the dielectric plate towards the center thereof, thereby generating a surface wave on the dielectric plate facing the substrate. As a result, the microwave power is uniformly radiated along radial directions into the vacuum chamber and plasma is uniformly generated from a reactive gas over a large area, so that even a large substrate may be processed uniformly.

18 Claims, 12 Drawing Sheets

MICROWAVE PLASMA PROCESSING APPARATUS AND PROCESSING METHOD USING THE SAME

BACKGROUND OF THE INVENTION

1. Field of the Invention

The present invention relates to a plasma processing apparatus and a processing method utilized for producing a semiconductor device, a liquid crystal panel, a solar cell, and the like, and more specifically to a plasma processing apparatus and a processing method utilized for various kinds of fine pattern technologies such as a thin-film deposition process and a dry etching process.

2. Description of the Related Art

In recent years, much active effort has been made in order to improve the performance of a device to be produced and reduce the necessary processing cost thereof. The objectives of such efforts are to improve the quality of the device; accelerate the processing rate; enlarge the processing area; and reduce the damage given to the device to be processed by the apparatus.

Japanese Patent Publications Nos. 62-43335, 53-44795 and 53-34461 disclose conventional microwave plasma processing apparatuses. However, since these microwave plasma processing apparatuses employ an electromagnet coil, such apparatuses become disadvantageously bulky in processing a large substrate. In addition, such apparatuses cannot process a substrate so uniformly.

Japanese Laid-Open Patent Publication No. 62-5600 discloses another conventional microwave plasma processing apparatus capable of processing a relatively large substrate. According to the technique described in this Patent Publication, the uniformity of the plasma processing is satisfactorily high in the propagating direction of the microwave. However, in the width direction perpendicular to the propagating direction of the microwave, the substrate is not exposed uniformly to the plasma, that is, the plasma density in the central portion of the substrate is high, while the density of the plasma in the end portions is low. Accordingly, such an apparatus is unable to process a large substrate for a solar cell, a liquid crystal panel, and the like entirely at one time. Moreover, since the area of the plasma generator facing the substrate to be processed is larger than that of the substrate to be processed, it is difficult to mount such a generator on a multi-chambered type apparatus.

U.S. Pat. No. 5,234,565 also relates to a microwave plasma processing apparatus. According to the technique disclosed in this patent, however, a microwave is radiated from a coaxial open end, so that the microwave has a high electric field intensity in the central portion of an inner conductor of a coaxial waveguide. Accordingly, such ununiform distribution of the microwave makes the density of the plasma ununiform, too. As a result, such an apparatus is unable to process a large substrate uniformly.

SUMMARY OF THE INVENTION

According to the present invention, a microwave plasma processing apparatus for generating plasma from a gas with microwave power is provided. The microwave plasma processing apparatus includes: a vacuum chamber including a gas inlet port and a gas outlet port; a holder for holding an object to be processed, the holder being disposed inside the vacuum chamber; a dielectric plate having a front surface facing the object to be processed and a rear surface substantially parallel to the front surface; and a microwave power supply means for supplying microwave power substantially inverse-radially from a circumferential side of the dielectric plate towards a center thereof.

In one embodiment, the front surface of the dielectric plate forms an integral part of an inner wall of the vacuum chamber, and plasma is formed by a surface wave of a microwave radiated from the front surface of the dielectric plate.

In another embodiment, the microwave power supply means has an inner conductor and an outer conductor of a coaxial waveguide, the inner conductor being disposed so as to be in contact with the rear surface of the dielectric plate, and the outer conductor surrounding the inner conductor, and the circumferential side of the dielectric plate is disposed so as to communicate with a gap formed between the inner conductor and the outer conductor.

In still another embodiment, the inner conductor of the microwave power supply means includes a door-knob shaped portion having a flat portion being in contact with the rear surface of the dielectric plate.

In still another embodiment, the microwave power supply means includes: a first metal conductor and a second metal conductor, the first metal conductor being disposed so as to be in contact with the rear surface of the dielectric plate, and the second metal conductor surrounding the first metal conductor. In the microwave power supply means, the first metal conductor is connected to an inner conductor of a coaxial waveguide, and the second metal conductor is connected to an outer conductor of the coaxial waveguide; and the circumferential side of the dielectric plate is disposed so as to communicate with a gap formed between the inner conductor and the outer conductor.

In still another embodiment, the first metal conductor of the microwave power supply means has a door-knob shaped portion, and the door-knob shaped portion has a flat portion being in contact with the rear surface of the dielectric plate.

In still another embodiment, the vacuum chamber comprises a portion made of a metal and a window portion for transmitting a microwave, and the window portion is covered with the dielectric plate.

In still another embodiment, the microwave plasma processing apparatus further includes a magnetic field generating means for generating a magnetic field in a space interposed between the dielectric plate and the object to be processed.

In still another embodiment, the microwave plasma processing apparatus further includes a metal electrode disposed on a rear surface of the dielectric plate, and a means for applying a radio-frequency voltage to the metal electrode.

According to another aspect of the present invention, a microwave plasma processing apparatus for generating plasma from a gas with microwave power is provided. The microwave plasma processing apparatus includes: a vacuum chamber including a gas inlet port and a gas outlet port; a holder for holding an object to be processed, the holder being disposed inside the vacuum chamber; a coaxial waveguide connecting with the vacuum chamber; an insulator preserving vacuum at the coaxial waveguide; a microwave generating means; a junction means for junctioning a microwave output from the microwave generating means so as to output the microwave to at least two rectangular waveguides; and a rectangular/coaxial transform means for receiving the microwave from the rectangular waveguides so as to output the microwave to the coaxial waveguide.

In one embodiment, the microwave plasma processing apparatus further includes: at least two microwave generating means for outputting a microwave to a rectangular waveguide; and a rectangular/coaxial transform means for receiving the microwave from the rectangular waveguide so as to output the microwave to the coaxial waveguide, the rectangular/coaxial transform means being substantially axisymmetric with respect to the coaxial waveguide.

In another embodiment, the microwave plasma processing apparatus further includes: at least two coaxial junction means for transmitting a microwave through the coaxial waveguide, the at least two coaxial junction means being connected to the coaxial waveguide and substantially axisymmetric with respect to the coaxial waveguide; and at least two microwave generating means for outputting the microwave to the at least two coaxial junction means.

In still another embodiment, the microwave plasma processing apparatus further includes: at least two coaxial junction means for transmitting a microwave through the coaxial waveguide, the at least two coaxial junction means being connected to the coaxial waveguide and substantially axisymmetric with respect to the coaxial waveguide; at least two matching means for matching impedances, the matching means being connected to the at least two coaxial junction means; and a microwave generating means for outputting the microwave to the coaxial waveguide.

According to still another aspect of the present invention, a method for processing an object with plasma in a vacuum chamber is provided. The method includes the steps of: introducing a gas into the vacuum chamber; supplying microwave power substantially inverse-radially from a circumferential side of a circular dielectric plate to a center of the circular dielectric plate, so as to radiate a surface wave of a microwave from a surface of the circular dielectric plate; and generating plasma from the gas with the microwave power.

In one embodiment, the plasma processing further includes a step of depositing a film on a surface of the object to be processed.

In another embodiment, the plasma processing further includes a step of etching at least a part of the object to be processed.

In still another embodiment, the plasma processing further includes a step of sputtering a target with the plasma, so as to deposit a film on the object to be processed.

A microwave is supplied so as to be inversely concentrated along radial directions (hereinafter, simply expressed by "inverse-radially") from a circumferential side of a dielectric plate to the center thereof, so that a surface wave is generated from the surface of the dielectric plate facing the substrate to be processed. As a result, microwave power is radiated uniformly in radial directions inside a vacuum chamber, thereby uniformly generating plasma from reaction gas over a large area. Accordingly, even if the substrate to be processed is large, the substrate may be processed uniformly.

The microwave transmitted through a coaxial waveguide basically in a transverse electric and magnetic (TEM) mode is supplied inverse-radially from a ring-shaped microwave radiating portion of the coaxial waveguide to the circumferential side of the dielectric plate, so that a surface wave is generated from the surface of the dielectric plate facing the substrate to be processed. As a result, microwave power is radiated uniformly inside the vacuum chamber, thereby uniformly generating plasma from reaction gas over a large area. Accordingly, even if the substrate to be processed is large, the substrate may be processed uniformly.

A magnetic field generating means is provided in the space between the dielectric plate and the substrate to be processed, so that the electrons in the plasma are trapped because of the interaction between the microwave and the generated magnetic field. As a result, the collision probability of the electrons and the neutral particles is increased; the density of the plasma may be high; a large substrate may be processed; and, in addition, the processing may be conducted at a higher rate. Furthermore, it becomes easier to generate the plasma at a low pressure below $10^{-3}$ Torr.

When the mode of the microwave power is transformed from a rectangular waveguide transmission mode into a coaxial waveguide transmission mode, the microwave, introduced from the inlet ports of the rectangular waveguide which are provided in substantially opposed positions, interfere with each other. As a result, the generation of higher modes of microwave adversely affecting the uniformity of the plasma processing may be suppressed; the microwave power is transmitted through the coaxial waveguide in a uniform mode; and therefore the microwave power is radiated uniformly at the end portion of the coaxial waveguide, thereby generating the plasma uniformly. For this reason, even a large substrate may be processed uniformly.

The microwave power introduced into at least two microwave power inlet ports provided at substantially opposed positions is originally oscillated by an identical microwave power oscillating means and then distributed to the inlet ports, so that the respective phases of the microwave power may be matched easily with each other. Accordingly, the generation of the higher mode inside the coaxial waveguide may be suppressed by adjusting the microwave power in a simple manner, thereby generating the plasma uniformly.

A junction means having a complicated construction is not required any longer. Accordingly, the generation of higher modes inside the coaxial waveguide may be suppressed under a simplified construction, thereby generating the plasma uniformly.

The generation of higher modes of microwave power owing to the mismatching which is caused by the presence of a junction in a coaxial waveguide may be suppressed. Accordingly, even if a junction is present, microwave power in a uniform mode may be transmitted through the coaxial waveguide, thereby generating the plasma uniformly.

Thus, the invention described herein makes possible the advantages of (1) providing a plasma processing apparatus capable of processing even a large substrate uniformly; and (2) providing a plasma processing apparatus having a compact plasma generator mounted thereon.

These and other advantages of the present invention will become apparent to those skilled in the art upon reading and understanding the following detailed description with reference to the accompanying figures.

DESCRIPTION OF THE PREFERRED EMBODIMENTS

Figure 1:
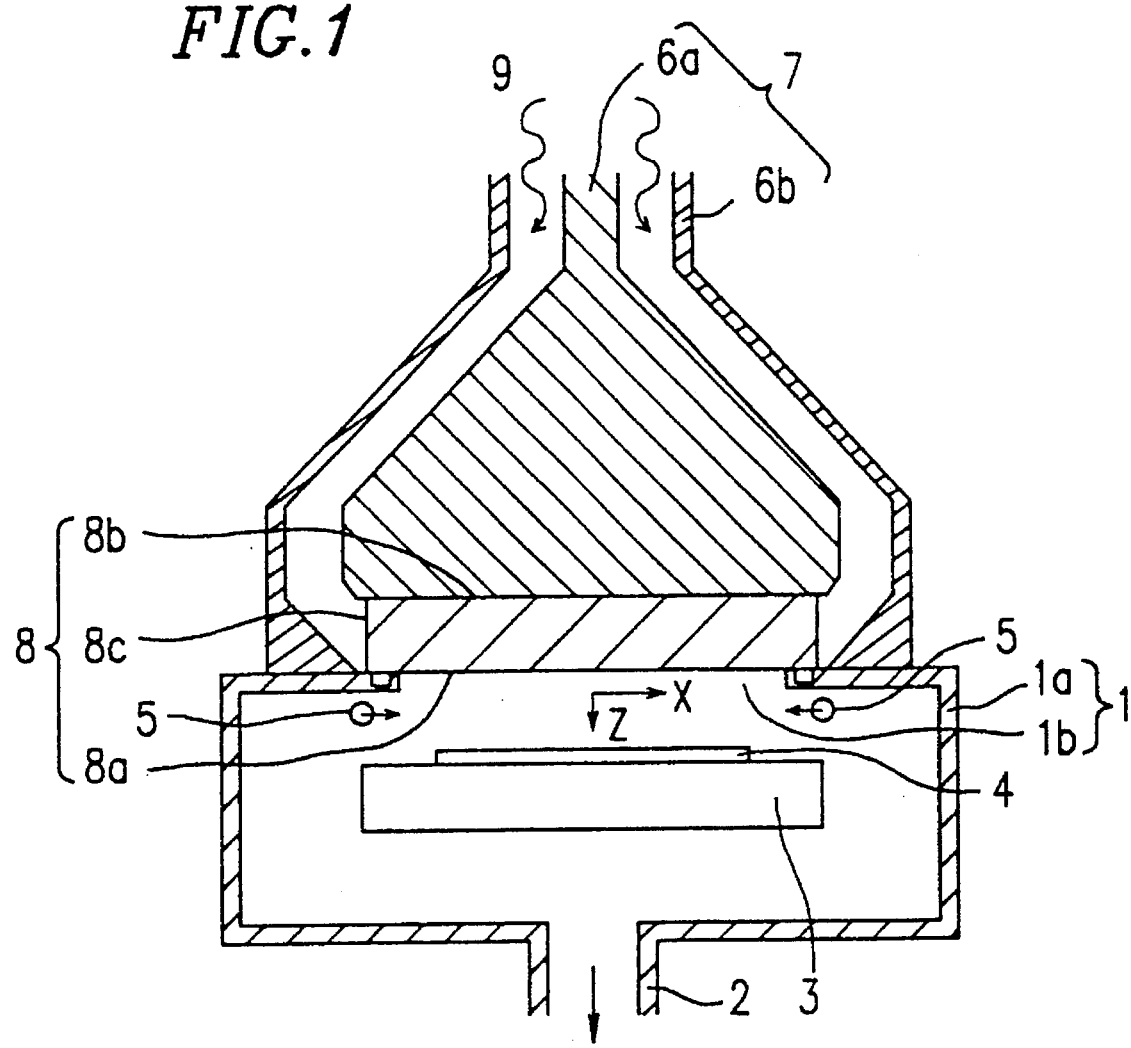
FIG. 1 is a cross-sectional view of a plasma processing apparatus according to a first example of the invention.

A microwave plasma processing apparatus according to the present invention generates plasma from reaction gas with microwave power so as to process an object such as a substrate with the plasma. Before describing the present invention, it is noted that "the plasma processing" herein means a process utilizing reaction gas in a plasma state, and that the plasma processing includes, for example, a plasma CVD process, a dry etching process, a sputtering process, and the like.

Hereinafter, the present invention will be described by way of illustrative examples with reference to the accompanying drawings. In the drawings, like reference numerals designate like parts corresponding to each other.

EXAMPLE 1

FIG. 1 shows a cross-section of a plasma processing apparatus according to the first example of the invention. This plasma processing apparatus includes a vacuum chamber 1 having gas inlet ports 5 and a gas exhaust outlet port 2. The gas outlet port 2 is connected to an evacuating system, thereby lowering the pressure inside the vacuum chamber 1 to a desired level. The gas for generating the plasma is introduced through the gas inlet ports 5 into the vacuum chamber 1. An appropriate kind of gas is selected as the gas for generating the plasma depending on what kind of plasma processing is to be conducted. The vacuum chamber 1 includes a portion 1a made of a metal material and a window portion (an opening) 1b for transmitting the microwave. The window portion 1b is covered with a circular dielectric plate 8 made of fused quartz (outer diameter φ: 500 mm; thickness: 22 mm; and dielectric constant: 3.8). This dielectric plate 8 includes two parallel surfaces, i.e., a front surface 8a and a rear surface 8b. The front surface 8a constitutes an integral part of an inner wall of the vacuum chamber 1.

A holder 3 for holding an object 4 to be processed is disposed at a position facing the front surface 8a of the dielectric plate 8 inside the vacuum chamber 1. A heater (not shown) for heating the object 4 to be processed, or a cooling system (mainly in the case of conducting a dry etching) is provided for the holder 3. The plasma is formed mainly in the space between the object 4 to be processed and the front surface 8a of the dielectric plate 8. In this example shown in FIG. 1, a substrate is used as the object 4 to be processed.

Under the construction according to this example, the microwave power is supplied substantially inverse-radially from a circumferential side 8c of the dielectric plate 8 toward the center of the dielectric plate 8. The microwave power supply system includes an inner conductor 6a (outer diameter: 21.3 mm to 522 mm) disposed so as be in contact with the rear surface 8b of the dielectric plate 8, and an outer conductor 6b (inner diameter: 49 mm to 550 mm) surrounding the inner conductor 6a. The inner conductor 6a and the outer conductor 6b constitute a coaxial waveguide 7.

Figure 2:
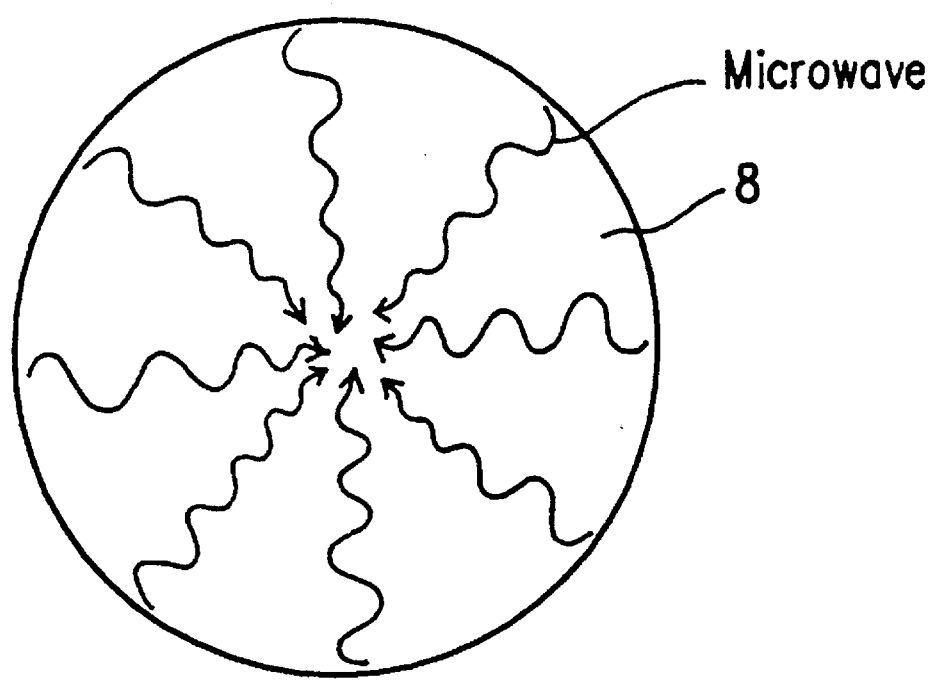
FIG. 2 is a top plan view schematically showing the transmission directions of a microwave when the dielectric plate is seen from an overhead direction.

The inner conductor 6a includes an axisymmetric door-knob shaped portion at one end thereof. The door-knob shaped portion has a tapered portion inclined at 45 degrees and a flat portion being in contact with the rear surface 8b of the dielectric plate 8. In the door-knob shaped portion, the outer diameter of the inner conductor 6a is enlarged from 21.3 mm to 522 mm, and the inner diameter of the outer conductor 6b is enlarged from 49 mm to 550 mm. The circumferential side 8c of the dielectric plate 8 is disposed so as to communicate with the gap formed between the inner conductor 6a and the outer conductor 6b of the coaxial waveguide 7. Accordingly, the microwave 9 (having a frequency of 2.45 GHz, for example) transmitted through the coaxial waveguide 7 is further transmitted through the dielectric plate 8 substantially inverse-radially from the circumferential side 8c of the dielectric plate 8 to the center thereof. As described above, according to the construction of this example, the microwave may be introduced to the circumferential side 8c of the dielectric plate 8 in radial directions with respect to the circumferential side 8c. FIG. 2 schematically shows the transmission directions of the microwave when the dielectric plate 8 is seen from a direction over the plate 8. One method for supplying a microwave to a coaxial waveguide 7 is described in U.S. Pat. No. 5,234,565.

According to the present invention, the microwave 9 is transmitted through the circular dielectric plate 8 substantially inverse-radially from the circumferential side 8c of the dielectric plate 8 towards the center thereof, so that the microwave in a surface wave mode is radiated from the front surface 8a of the dielectric plate 8. Such a surface wave forms plasma uniformly in the space between the front surface 8a and the object 4 to be processed. More specifically, the microwave 9 transmitted through the coaxial waveguide 7, basically in a TEM mode, is transmitted through the dielectric plate 8 inverse-radially from the circumference of the plate 8 to the center thereof. The microwave 9 transmitted through the dielectric plate 8 is coupled with the surface wave mode on the surface of the dielectric plate 8, and then transformed into the surface wave mode in the border between the dielectric plate 8 and the space in the vacuum chamber 1 so as to be radiated into the space.

Figure 3:
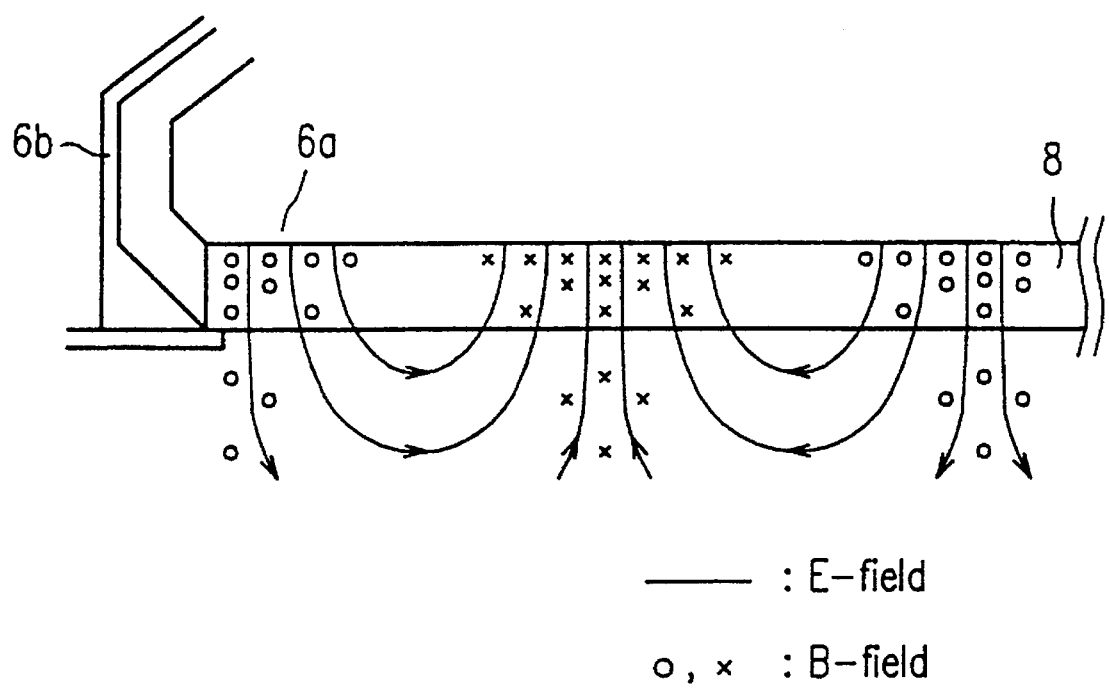
FIG. 3 is a view showing the distribution of the electromagnetic field of the microwave transmitted as the surface wave.

FIG. 3 shows the distribution of the electromagnetic field of the microwave to be transmitted as the surface wave. The microwave in a transverse magnetic (TM) mode is coupled with the surface wave mode (i.e., the microwave begins to be transmitted in the surface wave mode), when the thickness h of the dielectric plate 8 is larger than $(6.79 \tan^{-1}\epsilon) / \{f\sqrt{(\epsilon-1)}\}$, where f is a frequency of the microwave and $\epsilon$ is a dielectric constant of the dielectric plate 8. In this example, the thickness h of the dielectric plate 8 made of fused quartz was set at a value satisfying the above equation and being optimized for uniformly radiating the surface wave through the substrate 4 to be processed. However, since surface waves other than the TEM wave exist, the thickness h of the dielectric plate 8 is not limited to that obtained by the above equation, but may be optimized in accordance with the frequency of the microwave and the area of the substrate to be processed.

Referring to FIG. 1 again, the operation of the plasma processing apparatus having the above-described construction will be described below as being applied to a plasma CVD apparatus. First, the vacuum chamber 1 is evacuated. Next, the reactive gases $SiH_4$ and $H_2$ are simultaneously introduced through the gas inlet ports 5 into the chamber 1 at the rates of 30 cc/min. and 70 cc/min., respectively, and then the pressure inside the chamber 1 is lowered to be 20 mTorr. Then, the microwave having a power of 500 W is introduced into the coaxial waveguide 7. This microwave is transmitted basically in the TEM mode, i.e., a mode in which a microwave is transmitted through a coaxial waveguide, and the microwave is introduced inverse-radially from the circumferential side 8c of the dielectric plate 8 to the center thereof. Subsequently, the microwave is coupled with the surface wave, and radiated uniformly from the edge of the dielectric plate 8 into the vacuum chamber 1, so that plasma is generated uniformly over a large area. The active species in this plasma of silane gas are diffused and then transported onto the substrate 4 to be processed. As a result, on the surface of the substrate 4 heated at 250° C., an a-Si film is formed at a growth rate of 0.2 μm/min. and a uniformity of ±4.9% on a φ420 mm plane.

As is apparent from the description above, even a large substrate may be uniformly processed in this example.

In this example, the dielectric plate 8 made of fused quartz is used. Alternatively, the plate 8 may be made of a material capable of transmitting the microwave and maintaining the vacuum. Depending on the uses of the apparatus, the plate 8 may be formed, for example, of pyrex glass, alumina, teflon, boron nitride, or the like.

EXAMPLE 2

Figure 4:
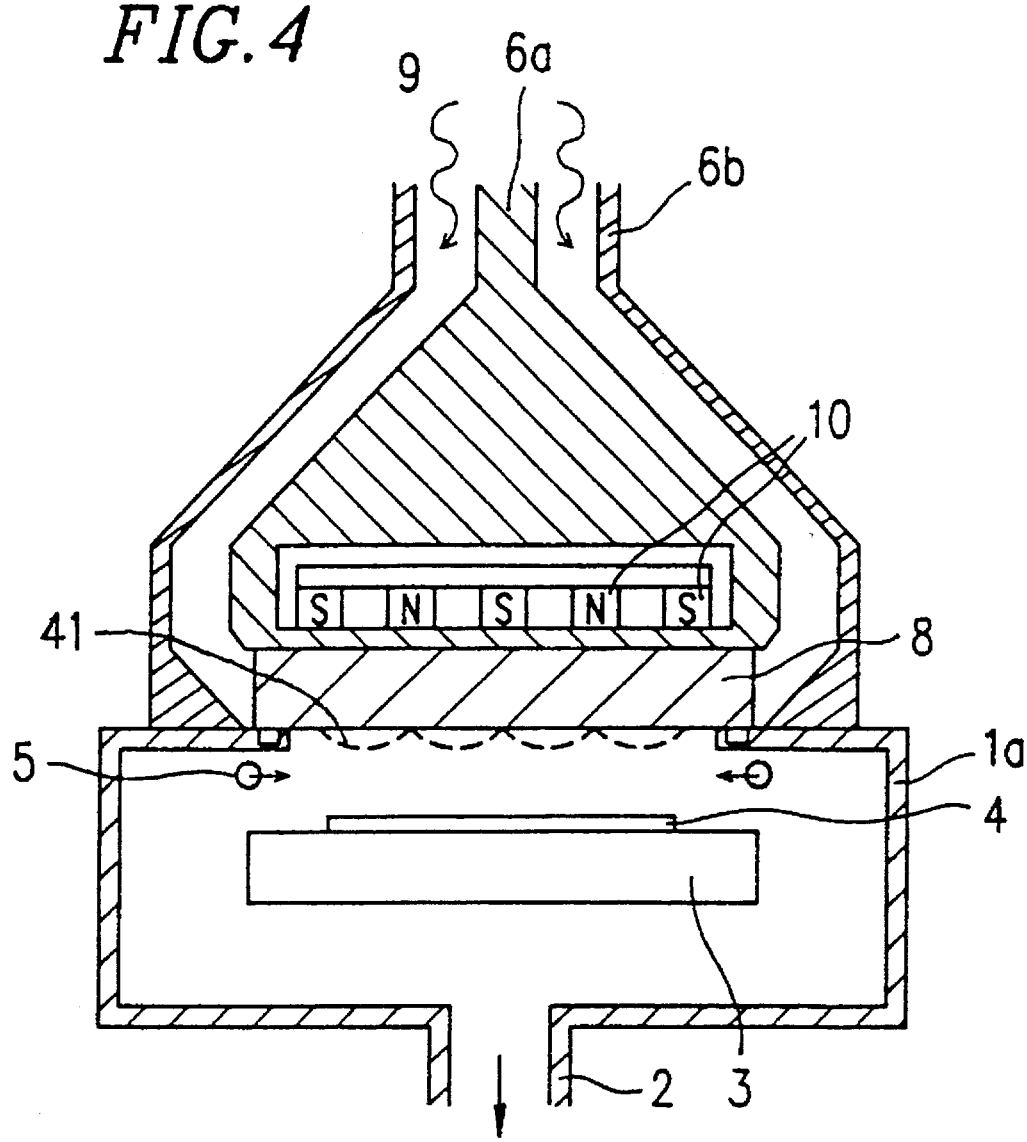
FIG. 4 is a cross-sectional view of a plasma processing apparatus according to a second example of the invention.

Hereinafter, a plasma processing apparatus according to a second example of the invention will be described with reference to FIG. 4. In FIG. 4, concentric permanent magnets (used as a magnetic field generating means) 10 disposed in the inner conductor 6a generates a magnetic field inside the vacuum chamber 1. The magnetic field intensity of the permanent magnets 10 on the surface thereof is 2.5 Kilo Gauss. The other components are the same as those used in the first example Referring to FIG. 4, the operation of the plasma processing apparatus having the above-described construction will be described below as being applied to a plasma CVD apparatus. In the same way as in Example 1, the vacuum chamber 1 is first evacuated, and then a reactive gas such as silane gas is supplied through the gas inlet ports into the chamber 1. A microwave having uniform distribution and being transmitted in a surface wave mode is radiated from the surface of the dielectric plate 8. Since the magnetic field 41 shown in FIG. 4 is formed by the permanent magnets 10 inside the vacuum chamber 1, the interaction between the microwave and the magnetic field traps the electrons included in the plasma, so that a plasma of high density is formed. Accordingly, plasma processing at an even higher rate is realized. An a-Si film was grown on the substrate 4 under the same conditions as those of Example 1. The a-Si film was able to be formed at a growth rate of 0.28 μm/min.

and a uniformity of ±4.2% on a φ420 mm plane. In addition, the plasma was able to be generated even in a low pressure of $10^{-3}$ Torr or lower.

The apparatus according to this example includes a magnetic-field generating unit in the space between the dielectric plate and the substrate to be processed besides the components of Example 1. Accordingly, not only large area processing becomes possible, but also the processing rate may be accelerated. Furthermore, the plasma may be generated easily even if pressure is low.

In this example, concentric permanent magnets member disposed inside the inner conductor 6a are employed as a magnetic-field generating means. Alternatively, a magnetic field may be generated in the space between the dielectric plate and the substrate to be processed by using an electromagnet coil instead.

Examples 1 and 2 have been described as being applied to a plasma CVD apparatus. The present invention may be applied to a dry etching apparatus by using various kinds of etching gases such as a fluorine-containing gas, a chlorine-containing gas, a bromine-containing gas, an iodine-containing gas, and an oxygen-containing gas.

EXAMPLE 3

Figure 5:
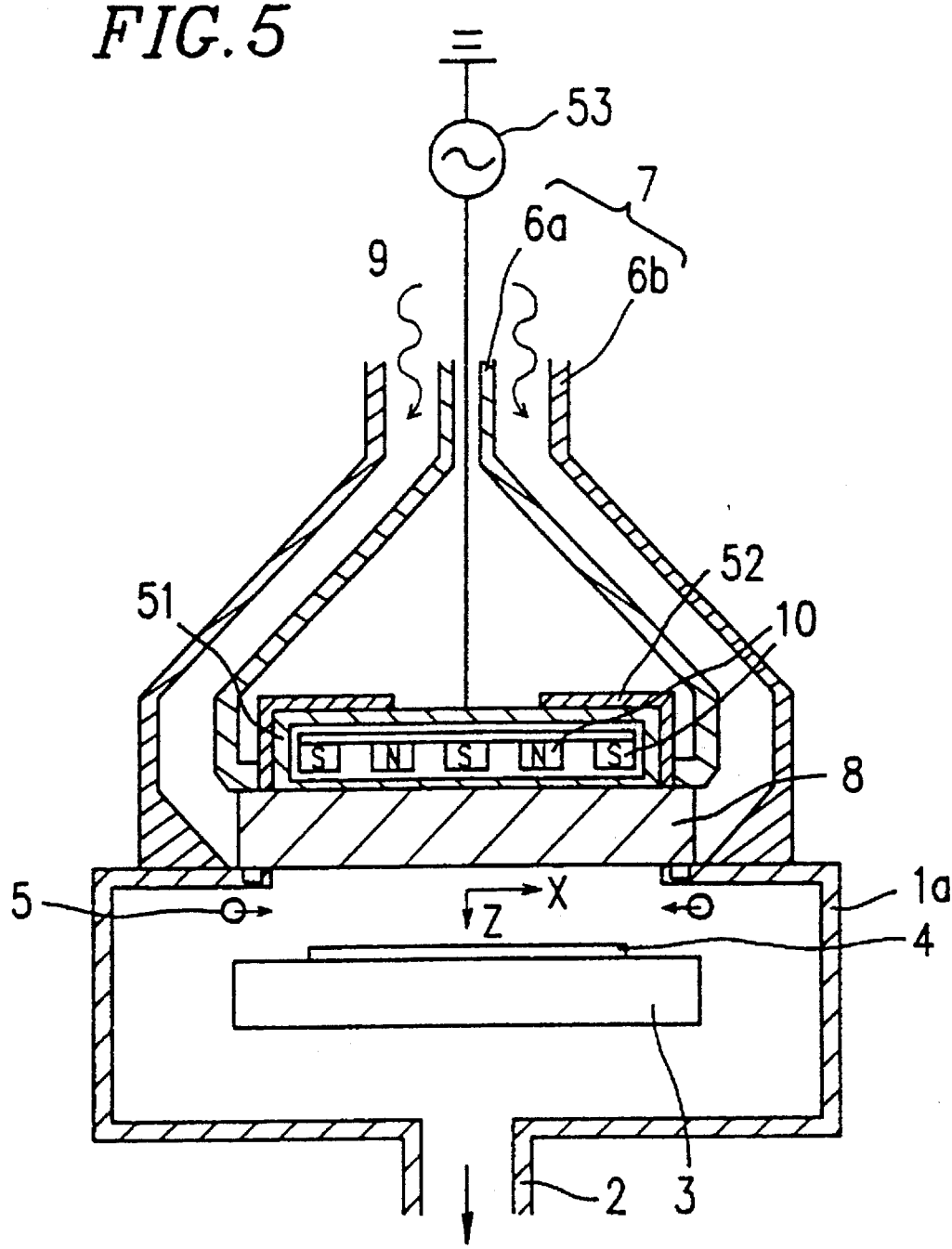
FIG. 5 is a cross-sectional view of a sputtering apparatus according to a third example of the invention.

Referring to FIG. 5, a sputtering apparatus according to another example of the invention will be described below. In FIG. 5, a dielectric plate 8 used also as a target is made of $SiO_2$, or the like. An electrode 51 is disposed on the rear surface 8b of the dielectric plate 8. A power having a radio frequency, e.g., a frequency of 13.56 MHz, is applied from a radio-frequency power supply 53 to the electrode 51. An insulator 52 made of teflon, or the like insulates the electrode 51. The dielectric plate 8 used as a target is placed so that the plate 8 forms an integral part of the vacuum chamber 1, and that the circumferential side 8c of the plate 8 communicates with the gap formed between the inner conductor 6a and the outer conductor 6b of the coaxial waveguide 7. The other components are the same as those used in the second example. In this example, the initial thickness of the dielectric plate 8 is set at a value considering the ablation of the dielectric plate 8 during the sputtering process. Under this construction, the target is required to be a dielectric transmitting a microwave.

Referring to FIG. 5, the operation of the sputtering apparatus having the above-described construction will be explained below. The vacuum chamber 1 is first evacuated; a reactive gas such as Ar gas is supplied through the gas inlet ports 5 into the chamber 1; and then the pressure inside the chamber 1 is lowered to be 0.3 mTorr. Next, a microwave having a power of 500 W is input into the coaxial waveguide 7 consisting of the inner conductor 6a and an outer conductor 6b, thereby transmitting the microwave inverse-radially from the circumferential side 8c of the $SiO_2$ dielectric plate 8 towards the center thereof. A mode is selected as a transmission mode of the microwave to be transmitted through the coaxial waveguide 7, so that a microwave is transmitted basically in a coaxial TEM mode. This microwave is coupled with a surface wave mode, and then radiated uniformly from the surface 8a of the dielectric plate 8 into the vacuum chamber 1. The interaction between the surface wave and the magnetic field generated by the permanent magnets 10 traps the electrons included in the plasma, so that the collision probability between the electrons and gas particles is increased, and a plasma having a high density and a high uniformity is generated. A radio-frequency electric field applied from the radio-frequency power supply 53 having an output power of 100 W to the electrode 51 generates a negative bias potential. The movement of the ions included in the Ar gas plasma is accelerated by the negative bias potential, so that the ions collide onto the target, i.e., the dielectric plate 8 made of $SiO_2$ so as to sputter the plate 8. In this example, an $SiO_2$ film was grown on the substrate 4 at a growth rate of 0.15 μm/min. and a uniformity of ±4.3% on a φ420 mm plane.

The sputtering apparatus according to this example of the invention includes a magnetic field generating unit in the vicinity of the front surface 8a of the dielectric plate 8 inside the vacuum chamber 1, thereby sputtering the target uniformly. As a result, a film may be grown at a high uniformity; the utility efficiency of the target may also be improved; and plasma having a high density may be generated and the sputtering process may be conducted under a high vacuum. In addition, the size of the device may be reduced.

Figure 6:
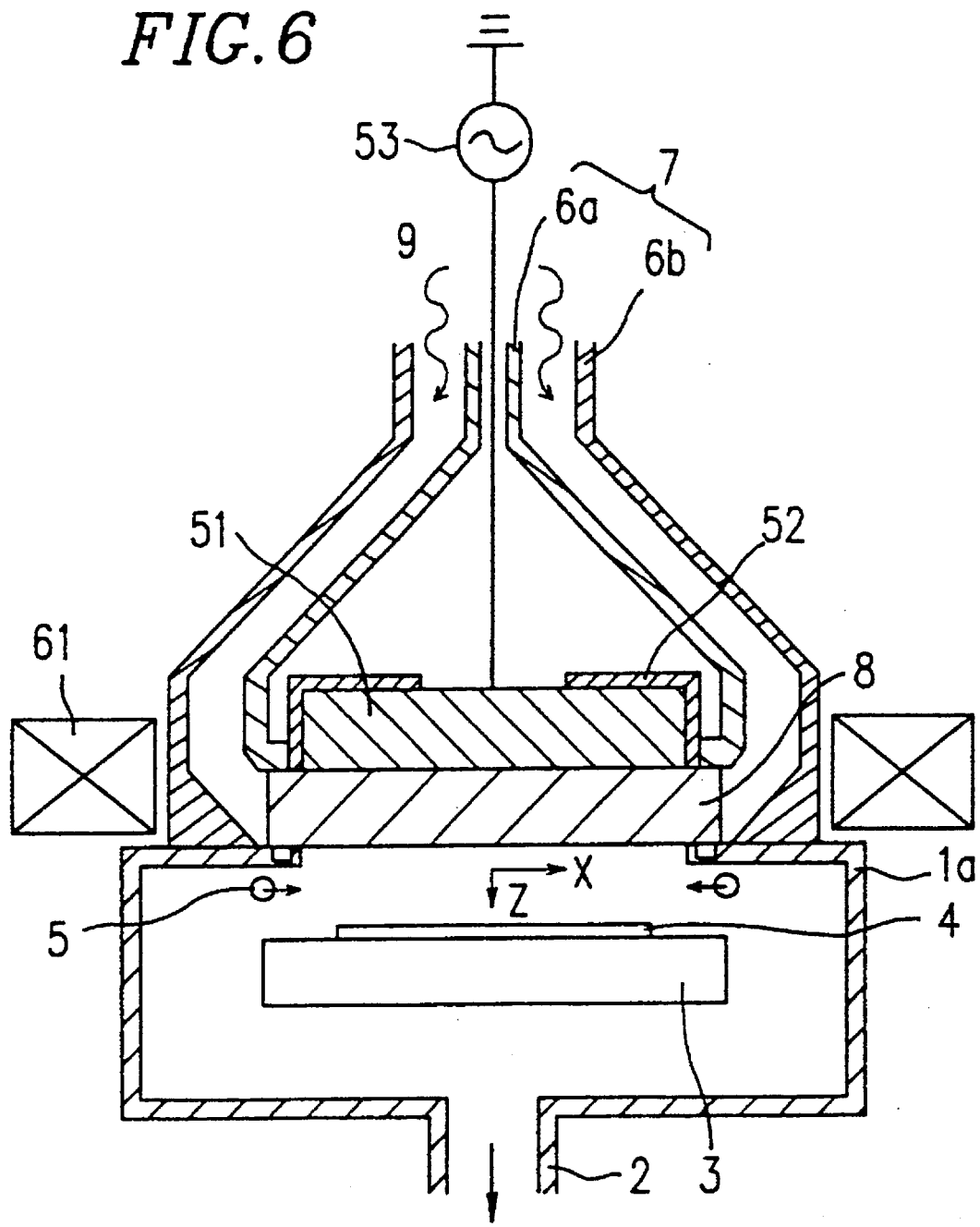
FIG. 6 is a cross-sectional view of a sputtering apparatus using an electromagnetic coil according to the third example of the invention.

In this example, the dielectric plate 8 used as a target is made of fused quartz. However, the plate 8 may be made of a material transmitting a microwave, e.g., alumina, $Ta_2O_5$, or the like. Concentric permanent magnets disposed inside the inner conductor 6a are employed as a magnetic-field generating means. Alternatively, a magnetic field may be generated in the space between the dielectric plate and the substrate to be processed by using an electromagnet coil 61 instead as shown in FIG. 6. In the case of using an electromagnet coil, the size of the device becomes bulky, but a magnetic field may be formed uniformly on the target. As a result, processing with a high uniformity and a high utility efficiency of the target are realized.

EXAMPLE 4

Figure 7:
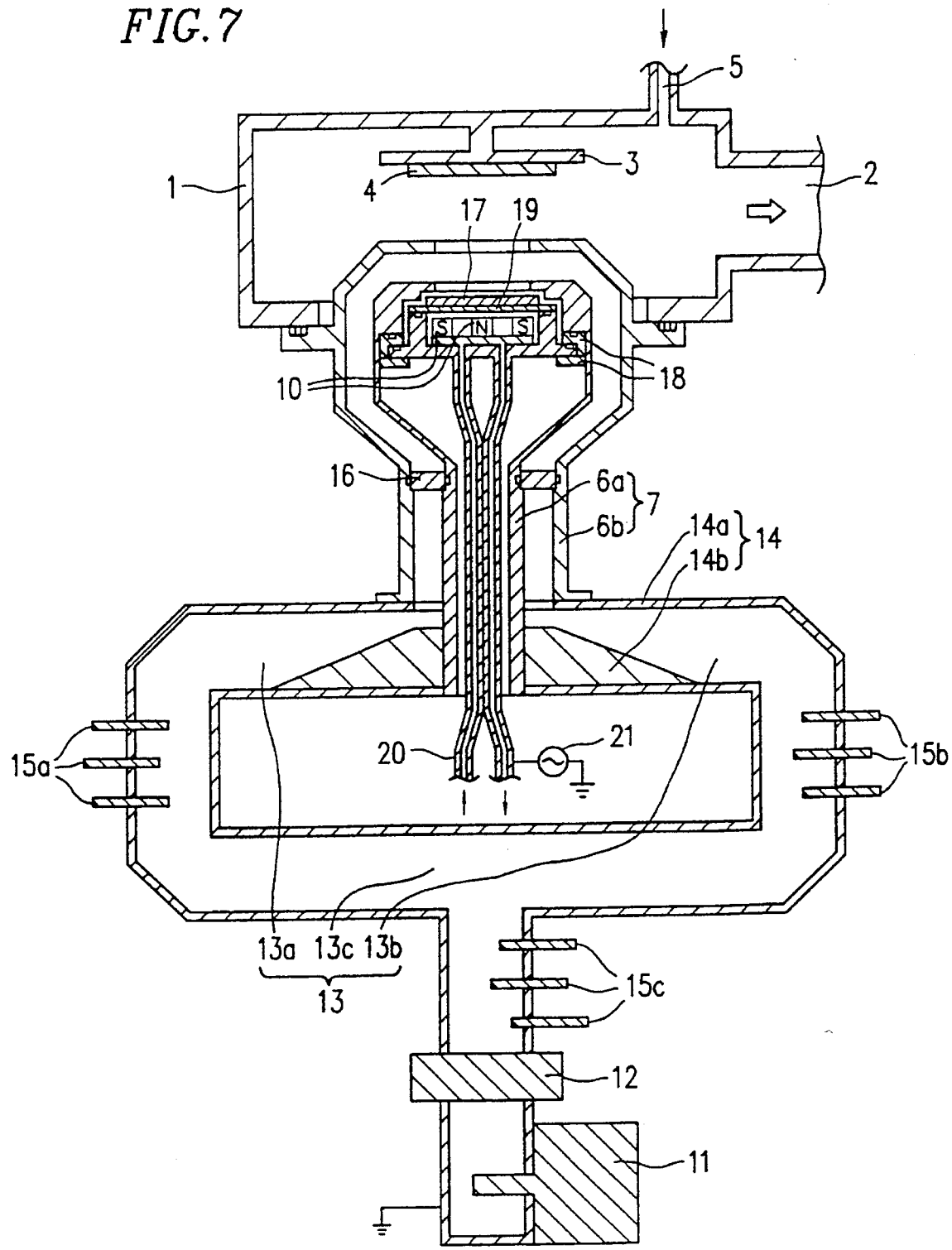
FIG. 7 is a cross-sectional view of a plasma processing apparatus according to a fourth example of the invention.

FIG. 7 shows a cross section of a reaction chamber of a microwave plasma processing apparatus according to another example of the present invention. Another objective of the present invention is to suppress the generation of higher modes of the microwave transmitted through a coaxial waveguide 7 so as to improve the uniformity of the processing. The microwave generated by a microwave generator and then introduced into a rectangular waveguide is input to the coaxial waveguide through a rectangular/coaxial transformer. In a coaxial waveguide, a microwave is transmitted mainly in a TEM mode. However, in an actual apparatus, higher modes is generated at the time of the rectangular/coaxial transformation. The generation of such higher modes creates a dispersion in the intensity distribution of the microwave, and degrades the uniformity of the plasma processing.

In FIG. 7, a microwave generator 11, e.g., a magnetron, generates a microwave having a frequency of 2.45 GHz. An isolator 12 isolates and absorbs the reflected wave. A junction unit 13 of the rectangular waveguide (cross section: 109 mm×54.5 mm) for transmitting the microwave consists of junction waveguides 13a and 13b and a junction 13c. The junction 13c is a rectangular waveguide of an E-plane, T junction. The junction waveguides 13a and 13b are respectively connected to the two outputs of the junction 13c. The junction waveguides 13a and 13b have an E corner and connect the junction 13c to both ends of the rectangular/coaxial transform unit 14 by bending the waveguide. The junction unit is provided with three-stub tuners 15a, 15b and 15c for matching the phases of the microwave. The rectangular/coaxial transform unit 14 includes a rectangular waveguide (cross section: 109 mm×54.5 mm) 14a for transmitting the microwave, and a ridge 14b constituted by a tapered block. To the center of the rectangular/coaxial transform unit 14, the coaxial waveguide 7 consisting of an inner conductor 6a (outer diameter: 24 mm) and an outer conductor 6b (inner diameter: 54 mm) are connected. The ridge 14b is disposed inside the rectangular waveguide 14a, and the inner conductor 6a of the coaxial waveguide 7 is connected to the ridge 14b. Both the inner conductor 6a and the outer conductor 6b of the coaxial waveguide 7 are enlarged in a taper-shape having an inclination angle of 45 degrees at the end thereof, and connected to a vacuum chamber 1 having an evacuation unit 2 for maintaining the vacuum. The coaxial waveguide 7 is sealed with a fused quartz window 16 used as an insulator for transmitting the microwave and maintaining the vacuum. The enlarged end portion of the inner conductor 6a of the coaxial waveguide 7 includes a cavity, and a target 17 is disposed in the cavity of the inner conductor 6a. A target holder 19 electrically insulated from the inner conductor 6a by a teflon plate 18 supports the target 17. Concentric permanent magnets 10 having a ring-shaped magnetic gap for generating a magnetic field on the surface of the target 17 is disposed inside the target holder 19. A water-cooling pipe 20 runs inside the inner conductor 6a of the coaxial waveguide 7. The permanent magnets 10 and the target 17 are cooled with the water running through the water-cooling pipe 20. The potential of the target 17 may be changed by applying a voltage to the electrically conductive water-cooling pipe 20. The other components are the same as those used in Examples 1 and 2.

The operation of the plasma processing apparatus having the above-described construction which is to be used as a microwave magnetron sputtering apparatus in this example of the invention will be described below. A microwave generated by the microwave generator 11 is transmitted through the rectangular waveguide in a transverse electric $(TE)_{10}$ mode. At the junction 13c, the microwave is transmitted to the junction waveguides 13a and 13b, so that an equal amount of power is distributed to the two junction waveguides 13a and 13b. The microwave transmitted through the junction waveguides 13a and 13b is input from both ends of the rectangular waveguide 14a of the rectangular/coaxial transform unit 14. The rectangular/coaxial transform unit 14 has a structure axisymmetric with respect to the inner conductor 6a of the coaxial waveguide 7. In the rectangular/coaxial transform unit 14, the transmission mode of the microwave is transformed from a rectangular waveguide transmission mode into a coaxial waveguide transmission mode by the function of the ridge 14b. The ridge 14b changes a characteristic impedance smoothly in order to connect the rectangular waveguide 14a and the coaxial waveguide 7 which is connected to the vacuum chamber 1 having different characteristic impedances, respectively. As a result, the reflection by the transform unit may be reduced to be low. In other words, the transmission mode may be transformed efficiently. When the transmission mode is transformed, the microwave is input from the two directions opposed to each other interposing the ridge 14b. The microwave to be input from the junction waveguides 13a and 13b may be in-phase by adjusting the three-stub tuners 15a and 15b. Total matching of the microwave is realized by adjusting a three-stub tuner 15c. In this way, the higher mode $TE_{10}$ wave in the coaxial waveguide 7, degrading the uniformity of the transmission mode, is interfered with each other so as to be cancelled. As a result, the $TE_{10}$ wave in the rectangular waveguide 14a is entirely transformed into the TEM wave in the coaxial waveguide 7 by the rectangular/coaxial transform unit 14, and therefore, only a uniform microwave is transmitted through the inner and the outer conductors 6a and 6b constituting the coaxial waveguide 7. Eventually, the uniform microwave is radiated at the end portion of the coaxial waveguide 7. The reflected wave may be reduced by adjusting the three-stub tuners 15a, 15b and 15c so as to realize the matching. As a result, the power level of the microwave contributing to the plasma processing may be high.

The gas inside the vacuum chamber 1 is evacuated through the gas outlet port 2, and then a reactive gas such as argon gas is introduced through the gas inlet ports 5 into the chamber 1, thereby lowering the gas pressure inside the chamber 1 to be $2\times10^{-2}$ Torr. As a result, uniform plasma is generated by the radiation of the microwave. The plasma is generated over the $SiO_2$ target 17 having a diameter of 76.2 mm. A magnetic field having an intensity of 100 to 200 Gauss has been formed on the target 17 by the concentric permanent magnets 10. The plasma is trapped by the ring-shaped magnetic gap, and the discharge in a magnetron mode is maintained. If the gas pressure is lowered to be $8\times10^{-4}$ Torr and if a radio frequency voltage having a frequency of, for example, 13.56 MHz is applied by the radio-frequency power supply 21, then the ions included in the plasma existing in the vicinity of the surface of the target 17 collide against the surface of the target 17. As a result, the particles included in the target 17 are discharged so as to reach the substrate 4 to be processed. In consequence, a thin film made of the components of the target 17 is formed on the substrate 4. The thin film thus obtained is excellent in uniformity because of the properties of the uniform plasma generated by the uniformly radiated microwave. In addition, the use of the rectangular/coaxial transform unit axisymmetric with respect to the inner conductor of the coaxial waveguide may reduce the dispersion in the intensity distribution of the microwave, thereby contributing to the formation of the uniform plasma, too.

Figure 8:
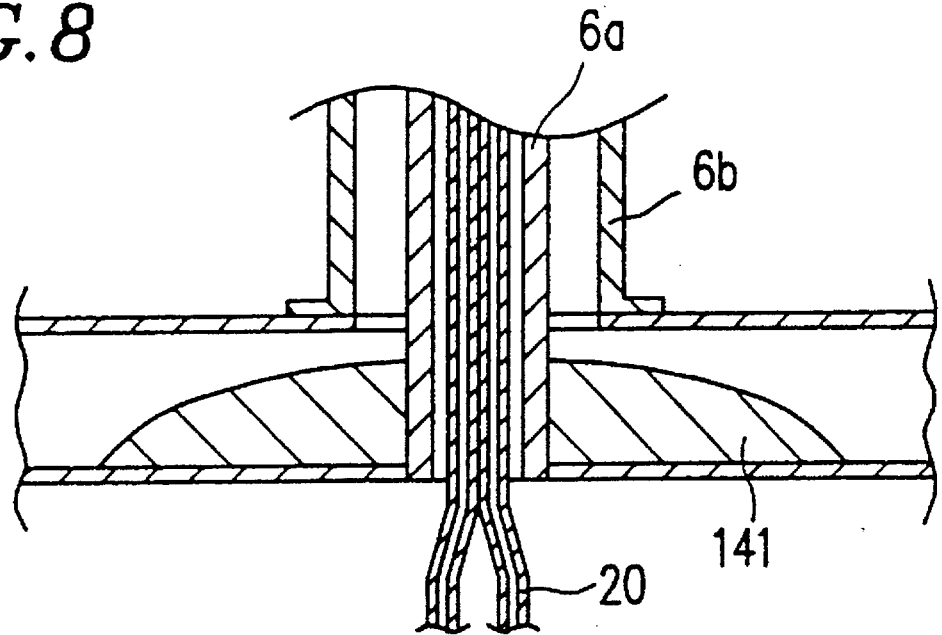
FIG. 8 is a cross-sectional view of a rectangular/coaxial transform unit using a curvilinearly tapered block.
Figure 9:
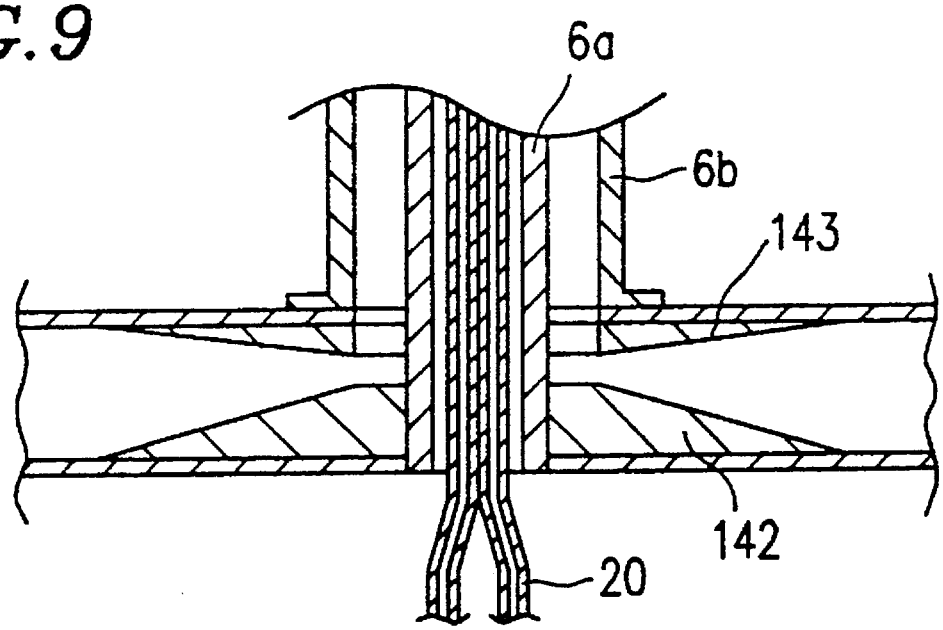
FIG. 9 is a cross-sectional view of a rectangular/coaxial transform unit using two tapered blocks which are disposed at opposed positions.
Figure 10:
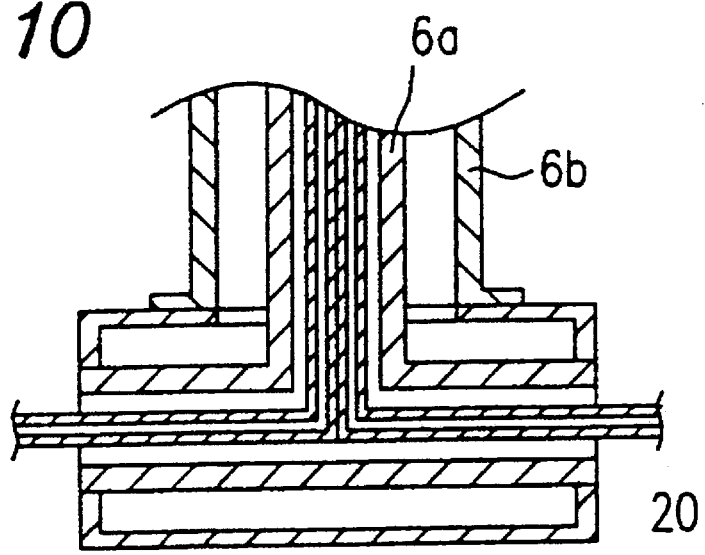
FIG. 10 is a cross-sectional view of a rectangular/coaxial transform unit using a T-shaped inner conductor.

In this Example 4, a linearly tapered block is used as the ridge 14b of the rectangular/coaxial transform unit. Alternatively, similar effects may be attained in the case of using a curvilinearly tapered block 141 shown in FIG. 8. Depending on a case, as shown in FIG. 9, two tapered blocks 142 and 143 may be provided on two inner faces of the rectangular waveguide which are opposed to each other. Furthermore, the inner conductor 6a of the coaxial waveguide 7 may be T-shaped as shown in FIG. 10.

In this example, a junction of an E-plane, T junction is used as the junction unit. Alternatively, other junction units such as a junction unit of an H-plane, T junction and a junction unit of an H-plane, Y junction may be used. The transform unit has an E corner in this example. However, the transmission waveguide may be constituted by using an H-corner, an E-bent, an H-bent, or the like, so long as the element may bend the waveguide.

The lengths of the junction waveguides 13a and 13b are the same in this example. However, since the phases may be adjusted by using the three-stub tuners 15a and 15b, there is no problem even if a difference exists in the lengths of the two waveguides. The junction 13c is a type of an E-plane junction, so that the outputs of the two ports appear in inverse phases. Accordingly, in the case where the length difference between the two junction waveguides 13a and 13b is expressed by $(n+\frac{1}{2})\lambda$ (where n is an integer and $\lambda$ is a wavelength of the microwave in a waveguide), the adjustment of the three-stub tuners 15a and 15b may be conducted easily and efficiently. In the case of using a junction of an H-plane, T junction, the outputs are in-phase after the microwave is transmitted through the junction. Accordingly, the length difference of the waveguides is preferably $n\lambda$.

In this example, all of the three-stub tuners 15a, 15b and 15c are employed. However, the matching of all the waveguides and the phase matching of the two junction waveguides are realized even if two of the three-stub tuners 15a and 15b are used without using the tuner 15c. Needless to say, either the tuner 15a or the tuner 15b may be omitted.

A rectangular/coaxial transform unit having two microwave inlet ports is used in this example. Alternatively, the same effects may be obtained by using a rectangular/coaxial transform unit having three or more microwave inlet ports. Also in such a case, the microwave inlet ports of the rectangular/coaxial transform unit are preferably axisymmetric with respect to the coaxial waveguide in order to form the plasma uniformly.

In this example as shown in FIG. 7 and Examples 5–7 as described later, the microwave reaches the space where the plasma is generated in a free-space propagation mode. Substituting a plasma processing apparatus utilizing the surface wave in Examples 1–3 for the post stage with respect to the coaxial waveguide 7 in this example and Examples 5–7 can realize more uniform plasma generation, whereby enabling a large substrate to be processed more uniformly.

EXAMPLE 5

Figure 11:
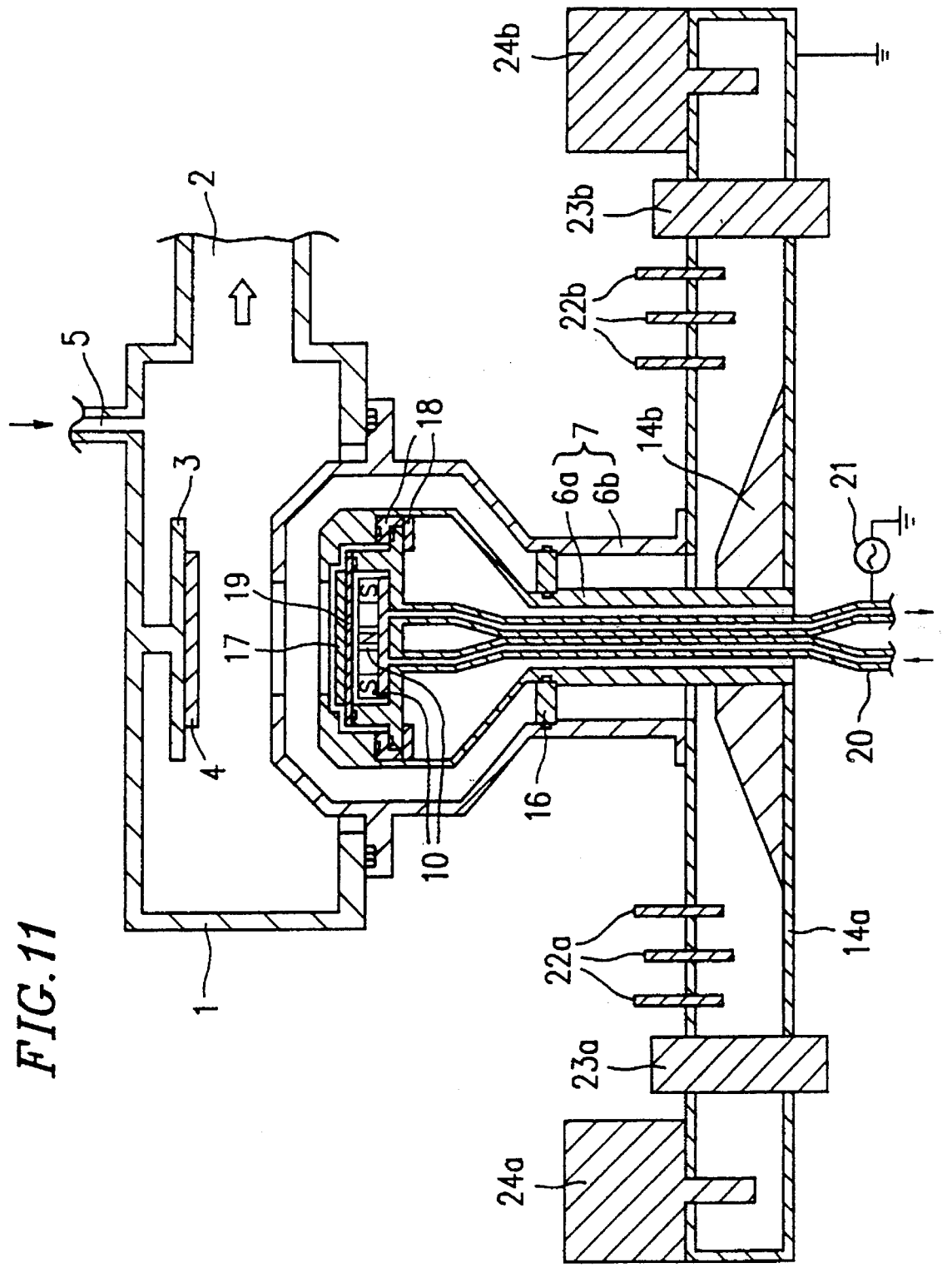
FIG. 11 is a cross-sectional view of a plasma processing apparatus according to a fifth example of the invention.

FIG. 11 shows a cross section of a reaction chamber of a microwave plasma processing apparatus according to still another example of the present invention. A rectangular waveguide 14a of a rectangular/coaxial transform unit according to the fifth example includes: two pairs of three-stub tuners 22a and 22b; two isolators 23a and 23b; two microwave generators, e.g., magnetrons 24a and 24b (both have a frequency of 2.45 GHz). All of these tuners, isolators and generators are disposed at the respective positions axisymmetric with respect to a ridge 14b. The other components are the same as those of Example 4.

In the plasma processing apparatus having the above-described construction, the microwaves oscillated by the microwave generators 24a and 24b are transmitted through the rectangular waveguide 14a and introduced from both sides of the ridge 14b into the coaxial waveguide 7. Accordingly, if the two pairs of three-stub tuners 22a and 22b are adjusted, then the same effects as those of Example 4 may be attained. Namely, a uniform TEM wave is transmitted through the coaxial waveguide 7 and therefore the plasma processing may be conducted uniformly. In this example, since the output of the microwaves generated by the two microwave generators may be synthesized, a microwave having a large output may be radiated, thereby processing a large object with the plasma.

EXAMPLE 6

Figure 12:
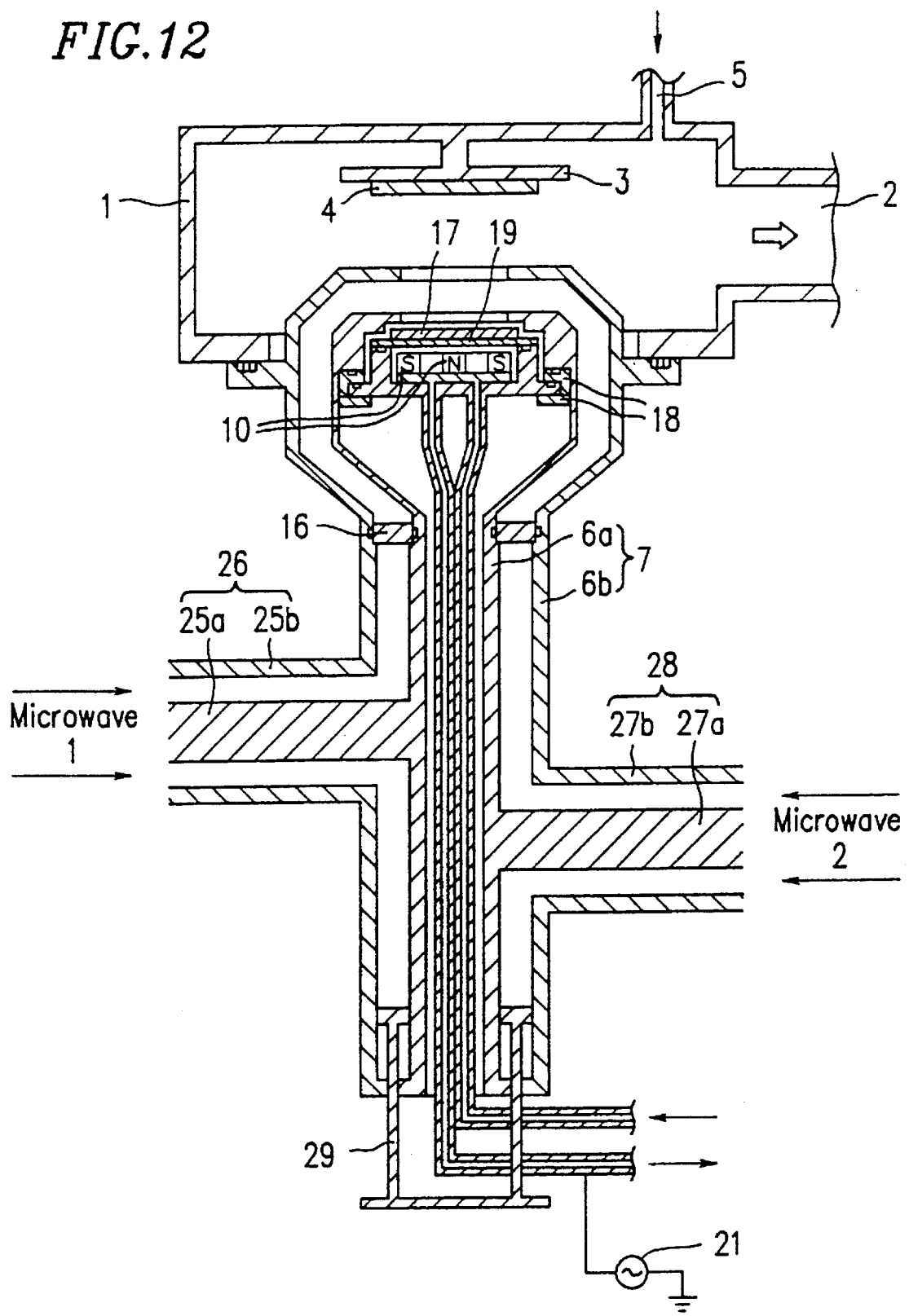
FIG. 12 is a cross-sectional view of a plasma processing apparatus according to a sixth example of the invention.

FIG. 12 shows a cross section of a reaction chamber of a microwave plasma processing apparatus according to still another example of the present invention. In the microwave plasma processing apparatus shown in FIG. 12, the microwave is transmitted through a first coaxial junction waveguide 26 consisting of an inner conductor 25a and an outer conductor 25b, and then introduced into the coaxial waveguide 7 consisting of an inner conductor 6a and an outer conductor 6b. In the same way, the microwave is also transmitted through a second coaxial junction waveguide 28 consisting of an inner conductor 27a and an outer conductor 27b, and then introduced into the coaxial waveguide 7. The distance between the central axis of the inner conductor 25a of the first coaxial junction waveguide 26 and that of the inner conductor 27a of the second coaxial junction waveguide 28 is 31 mm. This length corresponds to a quarter wavelength of a microwave having a frequency of 2.45 GHz. Three-stub tuners (not shown), isolators (not shown) and magnetrons (not shown) used as the microwave generators are connected to both junction waveguides 26 and 28. A plunger 29 is also provided for this processing apparatus so as to be used as a reflector of the microwave. The other components are the same as those of Example 3.

The operation of the microwave plasma processing apparatus having the above-described construction will be explained below. The microwave (microwave 1 and microwave 2 in FIG. 12) having a frequency of 2.45 GHz generated by the magnetrons are transmitted through the two junction waveguides 26 and 28 and introduced into the coaxial waveguide 7. Accordingly, if the two pairs of three-stub tuners connected to the junction waveguides 26 and 28 and the plunger 29 are adjusted, then the microwaves introduced through the junction waveguides 26 and 28 interfere with each other, thereby suppressing the generation of higher modes owing to the junction. As a result, a uniform TEM wave is transmitted through the coaxial waveguide 7. Except for the above-described operation, the apparatus of this Example 6 operates in the same manner as that of Example 1.

The microwave may be introduced through the two junction waveguides either by the method of Example 3 using the junction, or by the method of Example 4 using at least two microwave oscillating sources.

EXAMPLE 7

Figure 13:
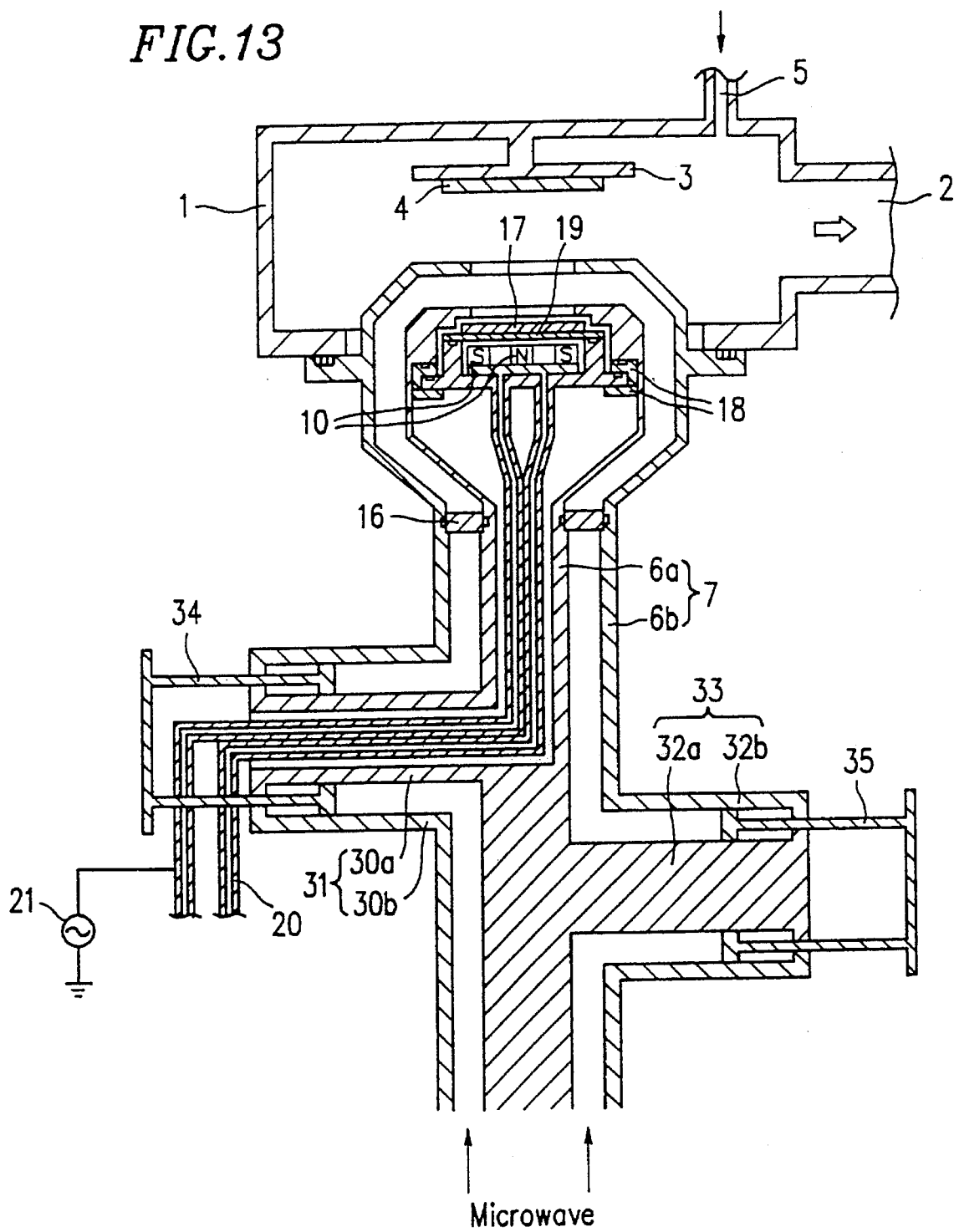
FIG. 13 is a cross-sectional view of a plasma processing apparatus according to a seventh example of the invention.

FIG. 13 shows a cross section of a reaction chamber of a microwave plasma processing apparatus according to still another example of the present invention. In the microwave plasma processing apparatus shown in FIG. 13, a first coaxial junction waveguide 31 consisting of an inner conductor 30a and an outer conductor 30b is provided with a plunger 34 for reflecting the microwave. A water-cooling pipe 20 runs inside the inner conductor 30a. A second coaxial junction waveguide 33 consisting of an inner conductor 32a and an outer conductor 32b is also provided with a plunger 35. The distance between the central axis of the inner conductor 30a of the first coaxial junction waveguide 31 and that of the inner conductor 32a of the second coaxial junction waveguide 33 is 31 mm. This length corresponds to a quarter wavelength of the microwave having a frequency of 2.45 GHz. Three-stub tuners (not shown), isolators (not shown) and magnetrons (not shown) used as the microwave generators are connected to the coaxial waveguide 7. The other components are the same as those of Example 5.

The operation of the microwave plasma processing apparatus having the above-described construction will be explained below. The microwaves having a frequency of 2.45 GHz oscillated by the magnetrons are transmitted through the coaxial waveguide 7 as TEM waves. Accordingly, if the three-stub tuners and the plungers 34 and 35 are adjusted, then the generation of higher modes caused by an incomplete matching in the coaxial junction waveguides may be suppressed owing to the function of the two junction waveguides. As a result, a uniform TEM wave is transmitted in the microwave radiating portion, posterior to the junction point of the coaxial waveguide 7, thereby forming the plasma having an excellent uniformity. In consequence, a uniform plasma processing may be realized.

In the above-described Examples 5 and 6, the distance between the central axes of the inner conductors included in both junction waveguides is set to be $\lambda/4$, where $\lambda$ is a wavelength of the microwave in a waveguide. However, the distance is not limited thereto, but may be $n\lambda/4$, where n is an integer.

In Examples 3, 4, 5 and 6, a microwave plasma processing apparatus of the present invention has been used as a microwave magnetron sputtering apparatus. This invention is not limited to this use, but may be applied to various apparatuses such as a plasma CVD apparatus or an etching apparatus. Also in such cases, a large substrate may be processed by using uniform plasma in the same way.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A microwave plasma processing apparatus for generating plasma from a gas with microwave power, comprising:

a vacuum chamber comprising a gas inlet port and a gas outlet port;

a holder for holding an object to be processed, the holder being disposed inside the vacuum chamber;

a dielectric plate having a front surface facing the object to be processed and a rear surface substantially parallel to the front surface; and a microwave power supply means for supplying microwave power substantially inverse-radially from a circumferential side of the dielectric plate towards a center thereof, the microwave power having a direction of propagation which is substantially inverse-radial at the circumferential side of the dielectric plate.

2. A microwave plasma processing apparatus according to claim 1, wherein the front surface of the dielectric plate forms an integral part of an inner wall of the vacuum chamber, and wherein plasma is formed by a surface wave of a microwave radiated from the front surface of the dielectric plate.

3. A microwave plasma processing apparatus according to claim 1, wherein the microwave power supply means has an inner conductor and an outer conductor of a coaxial waveguide, the inner conductor being disposed so as to be in contact with the rear surface of the dielectric plate, and the outer conductor surrounding the inner conductor, and wherein the circumferential side of the dielectric plate is disposed so as to communicate with a gap formed between the inner conductor and the outer conductor.

4. A microwave plasma processing apparatus according to claim 3, wherein the inner conductor of the microwave power supply means comprises a door-knob shaped portion having a flat portion being in contact with the rear surface of the dielectric plate.

5. A microwave plasma processing apparatus according to claim 1, the microwave power supply means comprising:

a first metal conductor and a second metal conductor, the first metal conductor being disposed so as to be in contact with the rear surface of the dielectric plate, and the second metal conductor surrounding the first metal conductor, wherein the first metal conductor is connected to an inner conductor of a coaxial waveguide, and the second metal conductor is connected to an outer conductor of the coaxial waveguide; and wherein the circumferential side of the dielectric plate is disposed so as to communicate with a gap formed between the inner conductor and the outer conductor.

6. A microwave plasma processing apparatus according to claim 5, wherein the first metal conductor of the microwave power supply means has a door-knob shaped portion, and the door-knob shaped portion has a flat portion being in contact with the rear surface of the dielectric plate.

7. A microwave plasma processing apparatus according to claim 6, wherein the vacuum chamber comprises a portion made of a metal and a window portion for transmitting a microwave, and the window portion is covered with the dielectric plate.

8. A microwave plasma processing apparatus according to claim 1 further comprising a magnetic field generating means for generating a magnetic field in a space interposed between the dielectric plate and the object to be processed.

9. A microwave plasma processing apparatus according to claim 8 further comprising a metal electrode disposed on a rear surface of the dielectric plate, and a means for applying a radio-frequency voltage to the metal electrode.

10. A microwave plasma processing apparatus for generating plasma from a gas with microwave power, comprising:

a vacuum chamber comprising a gas inlet port and a gas outlet port;

a holder for holding an object to be processed, the holder being disposed inside the vacuum chamber;

a coaxial waveguide connecting with the vacuum chamber;

an insulator preserving vacuum at the coaxial waveguide;

a microwave generating means;

a junction means for junctioning a microwave output from the microwave generating means so as to output the microwave to at least two rectangular waveguides; and a rectangular/coaxial transform means for receiving the microwave from the rectangular waveguides so as to output the microwave to the coaxial waveguide.

11. A microwave plasma processing apparatus according to claim 10, further comprising:

at least two microwave generating means for outputting a microwave to a rectangular waveguide; and a rectangular/coaxial transform means for receiving the microwave from the rectangular waveguide so as to output the microwave to the coaxial waveguide, the rectangular/coaxial transform means being substantially axisymmetric with respect to the coaxial waveguide.

12. A microwave plasma processing apparatus according to claim 10, further comprising:

at least two coaxial junction means for transmitting a microwave through the coaxial waveguide, the at least two coaxial junction means being connected to the coaxial waveguide and substantially axisymmetric with respect to the coaxial waveguide; and at least two microwave generating means for outputting the microwave to the at least two coaxial junction means.

13. A microwave plasma processing apparatus according to claim 10, further comprising:

at least two coaxial junction means for transmitting a microwave through the coaxial waveguide, the at least two coaxial junction means being connected to the coaxial waveguide and substantially axisymmetric with respect to the coaxial waveguide;

at least two matching means for matching impedances, the matching means being connected to the at least two coaxial junction means; and a microwave generating means for outputting the microwave to the coaxial waveguide.

14. A method for processing an object with plasma in a vacuum chamber, comprising the steps of:

introducing a gas into the vacuum chamber;

supplying microwave power substantially inverse-radially from a circumferential side of a circular dielectric plate to a center of the circular dielectric plate, the microwave power having a direction of propagation which is substantially inverse-radial at the circumferential side of the circular dielectric plate so as to radiate a surface wave of a microwave from a surface of the circular dielectric plate; and generating plasma from the gas with the microwave power.

15. A method according to claim 14, wherein the plasma processing further comprises a step of depositing a film on a surface of the object to be processed.

16. A method according to claim 14, wherein the plasma processing further comprises a step of etching at least a part of the object to be processed.

17. A method according to claim 14, wherein the plasma processing further comprises a step of sputtering a target with the plasma, so as to deposit a film on the object to be processed.

18. A method according to claim 14, wherein:

the microwave power is supplied by an inner conductor and an outer conductor of a coaxial waveguide, the inner conductor being disposed so as to be in contact with a rear surface of the dielectric plate, and the outer conductor surrounding the inner conductor;

the circumferential side of the dielectric plate is disposed so as to communicate with a gap formed between the inner conductor and the outer conductor; and the inner conductor comprises a door-knob shaped portion having a flat portion being in contact with the rear surface of the dielectric plate.

* * * * *